(12) United States Patent
McBain (10) Patent No.: US 8,641,928 B2
(45) Date of Patent: Feb. 4, 2014

(54) STRETCHED ARTICLES SUITABLE FOR USE AS EMI ABSORBERS

(75) Inventor: Douglas S. McBain, Wadsworth, OH (US)

(73) Assignee: Laird Technologies, Inc., Earth City, MO (US)

( * ) Notice: Subject to any disclaimer, the term of this patent is extended or adjusted under 35 U.S.C. 154(b) by 0 days.

(21) Appl. No.: 13/475,898

(22) Filed: May 18, 2012

(65) Prior Publication Data

US 2012/0228018 A1    Sep. 13, 2012

Related U.S. Application Data

(63) Continuation of application No. PCT/US2010/058477, filed on Dec. 1, 2010.

(60) Provisional application No. 61/265,991, filed on Dec. 2, 2009.

(51) Int. Cl.
*H01B 1/00*        (2006.01)
*H01B 1/02*        (2006.01)
*H05K 9/00*        (2006.01)
*B31B 43/00*       (2006.01)

(52) U.S. Cl.
USPC ......... 252/500; 252/521.2; 174/350; 493/339

(58) Field of Classification Search
USPC ............... 252/500–521.6; 428/98; 174/350; 493/339
See application file for complete search history.

(56) References Cited

U.S. PATENT DOCUMENTS

| 4,791,016 | A | * | 12/1988 | Schulte et al. | 428/220 |
| 6,080,337 | A | * | 6/2000 | Kambe et al. | 252/521.1 |
| 2004/0089851 | A1 | * | 5/2004 | Wang et al. | 252/500 |
| 2005/0163987 | A1 | * | 7/2005 | Kliesch et al. | 428/220 |
| 2005/0244609 | A1 | | 11/2005 | Arakawa et al. | |
| 2006/0108567 | A1 | * | 5/2006 | Charati et al. | 252/500 |
| 2008/0084681 | A1 | | 4/2008 | Naito et al. | |

OTHER PUBLICATIONS

International Search Report and Written Opinion dated Aug. 26, 2011 from International application No. PCT/US2010/058477 (published as WO 2011/068819); 8 pages. The instant application is a continuation of PCT/US2010/058477.

* cited by examiner

*Primary Examiner* — Mark Kopec
*Assistant Examiner* — Jaison Thomas
(74) *Attorney, Agent, or Firm* — Harness, Dickey & Pierce, P.L.C.

(57) ABSTRACT

An exemplary embodiment of a method of making an electromagnetic interference (EMI) absorber includes stretching a material that includes EMI absorbing particles along at least a first axis to align at least some EMI absorbing particles.

21 Claims, 4 Drawing Sheets

STRETCHED ARTICLES SUITABLE FOR USE AS EMI ABSORBERS

CROSS-REFERENCE TO RELATED APPLICATIONS

This application is a continuation of PCT International Application No. PCT/US2010/058477 filed Dec. 1, 2010 (now published as WO 2011/068819) which, in turn, claims priority to and the benefit of U.S. Provisional Application No. 61/265,991 filed Dec. 2, 2009. The entire disclosures of the above applications are incorporated herein by reference.

FIELD

The present disclosure relates to stretched articles suitable for use as EMI absorbers.

BACKGROUND

This section provides background information related to the present disclosure which is not necessarily prior art.

Electronic equipment often generates electromagnetic signals in one portion of the electronic equipment that may radiate to and interfere with another portion of the electronic equipment. This electromagnetic interference (EMI) can cause degradation or complete loss of important signals, thereby rendering the electronic equipment inefficient or inoperable. To reduce the adverse effects of EMI, electrically conducting (and sometimes magnetically conducting) material may be interposed between portions of the electronic circuitry for absorbing and/or reflecting EMI energy. This shielding may take the form of a wall or a complete enclosure and may be placed around the portion of the electronic circuit generating the electromagnetic signal and/or may be placed around the portion of the electronic circuit that is susceptible to the electromagnetic signal. For example, electronic circuits or components of a printed circuit board (PCB) are often enclosed with shields to localize EMI within its source, and to insulate other devices proximal to the EMI source.

As used herein, the term electromagnetic interference (EMI) should be considered to generally include and refer to both electromagnetic interference (EMI) and radio frequency interference (RFI) emissions, and the term "electromagnetic" should be considered to generally include and refer to both electromagnetic and radio frequency from external sources and/or internal sources. Accordingly, the term shielding (as used herein) generally includes and refers to both EMI shielding and RFI shielding, for example, to prevent (or at least reduce) ingress and egress of EMI and RFI relative to a housing or other enclosure in which electronic equipment is disposed.

SUMMARY

This section provides a general summary of the disclosure, and is not a comprehensive disclosure of its full scope or all of its features.

An exemplary embodiment of a method of making an electromagnetic interference (EMI) absorber includes stretching a material that includes EMI absorbing particles along at least a first axis to align at least some EMI absorbing particles.

Another exemplary embodiment includes an electromagnetic interference (EMI) absorber. The absorber includes a material that has been stretched along a first axis and that includes EMI absorbing flakes. At least some of the EMI absorbing particles are aligned generally parallel with the first axis.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

DETAILED DESCRIPTION

Example embodiments will now be described more fully with reference to the accompanying drawings.

EMI absorbers function to absorb electromagnetic energy (that is, EMI). EMI absorbers convert electromagnetic energy into another form of energy through a process commonly referred to as a loss. Electrical loss mechanisms include conductivity losses, dielectric losses, and magnetization losses. Conductivity losses refer to a reduction in EMI resulting from the conversion of electromagnetic energy into thermal energy. The electromagnetic energy induces currents that flow within an EMI absorber having a finite conductivity. The finite conductivity results in a portion of the induced current generating heat through a resistance. Dielectric losses refer to a reduction in EMI resulting from the conversion of electromagnetic energy into mechanical displacement of molecules within an absorber having a non-unitary relative dielectric constant. Magnetic losses refer to a reduction in EMI resulting from the conversion of electromagnetic energy into a realignment of magnetic moments within an EMI absorber.

According to exemplary aspects of the present disclosure, there are provided various exemplary embodiments of stretched articles (e.g., films, sheets, three dimensional objects or items, etc.) that are suitable for use as EMI absorbers. For example, an exemplary embodiment includes an electromagnetic interference (EMI) absorber that generally includes a material (e.g., matrix material, sheet, substrate, etc.) that has been stretched along a first axis and that includes EMI absorbing flakes. At least some of the EMI absorbing particles are aligned generally parallel with the first axis.

Other exemplary aspects of the present disclosure relate to methods of making EMI absorbers. An exemplary embodiment of a method of making an electromagnetic interference (EMI) absorber includes stretching a material (e.g., matrix material, sheet, substrate, etc.) that includes EMI absorbing particles along at least a first axis to align at least some EMI absorbing particles.

Figure 1:
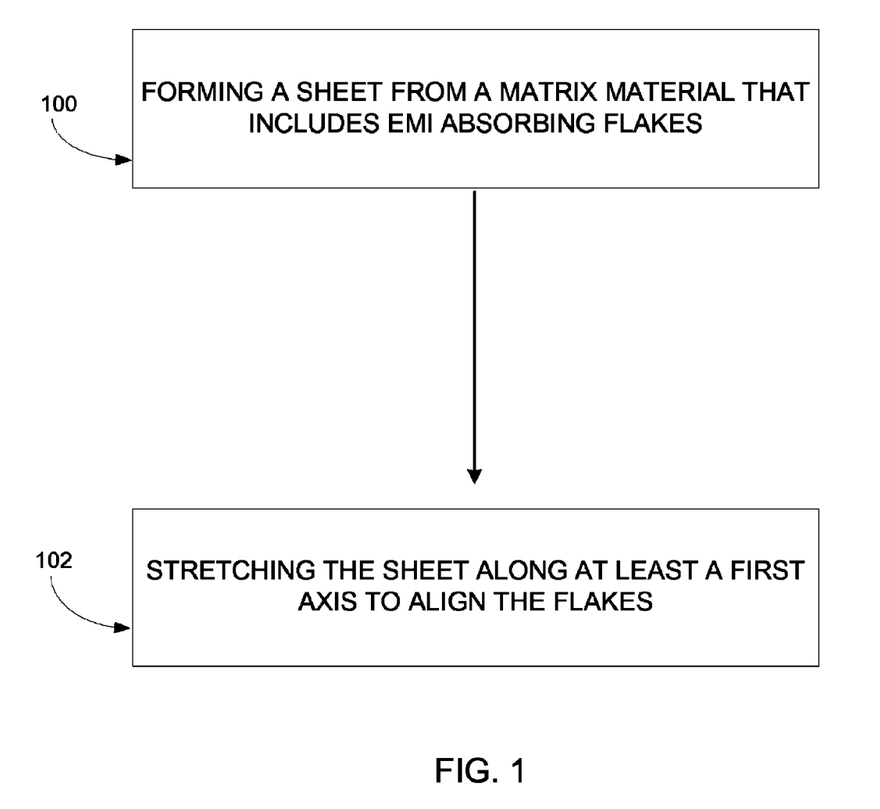
FIG. 1 is a block diagram of an exemplary method of making an electromagnetic interference (EMI) absorber.

With reference now to the figures, FIG. 1 illustrates an exemplary method of making an EMI absorber (e.g., film, sheet, article, three dimensional object or item, etc.) embodying one or more aspects of the present disclosure. As shown in FIG. 1, this method includes step, process, or operation 100 at which a sheet is made or formed from a matrix loaded with filler that includes EMI absorbing flakes. The EMI absorbing flakes may be suspended in the matrix material in a generally random or unaligned orientation. Alternative embodiments may include one or more steps, processes, or operations in which the matrix material loaded with filler that includes EMI absorbing flakes is made or formed into a three dimensional item or object that is not a sheet. Also, the stretched article (e.g., film, sheet, three dimensional object or item, etc.) may be made or formed from the matrix material loaded with filler that includes EMI absorbing flakes by a wide range of suitable processes, such as extrusion, blown film extrusion, stretch blow molding, etc. In some embodiments, the EMI absorber comprises a multi-layer structure that has been stretched, such as by sheet extruders and the like. In these embodiments, a method of making an EMI absorber may thus generally include stretching a multi-layer structure, such as by sheet extruders and the like.

Figure 3:
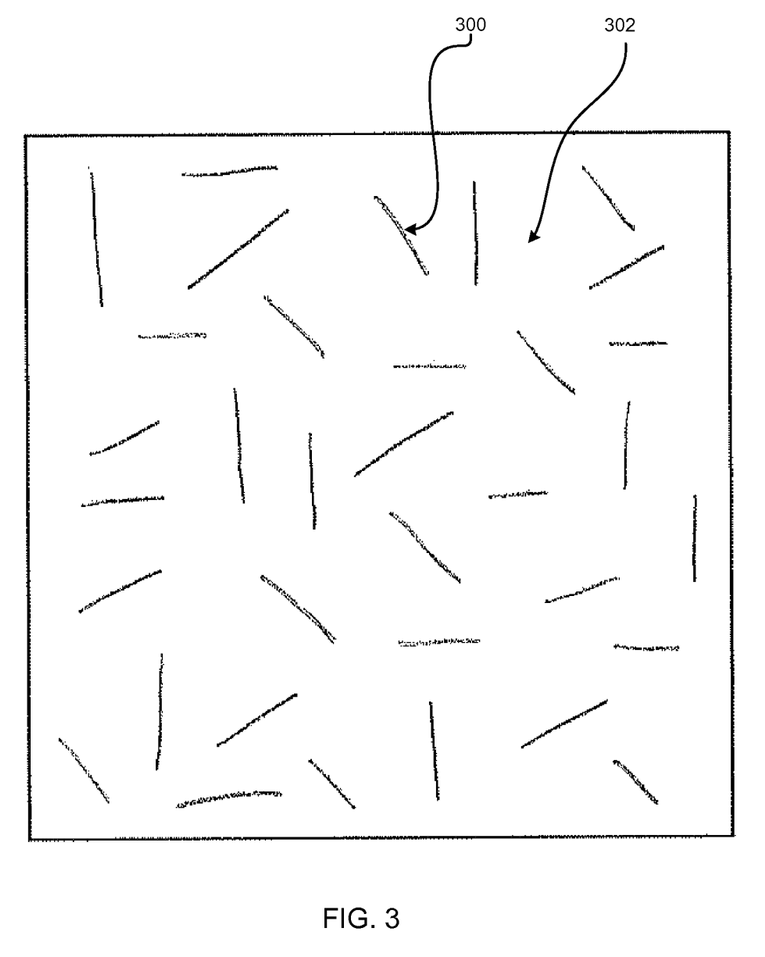
FIG. 3 illustrates an example of EMI absorbing flakes suspended in matrix material before stretching.

By way of example, FIG. 3 illustrates unaligned EMI absorbing flakes 300 that are suspended in a matrix material 302. For this particular illustrated embodiment, the EMI absorbing materials are in the form of elongate flakes. Some embodiments may include EMI absorbing flakes having aspect ratios falling within a range of about 10 to about 140. EMI absorbing flakes having an aspect ratio less than 10 or greater than 140 may also be used. Other embodiments may have EMI absorbing flakes all having aspect ratios of about 10, while other embodiments may have EMI absorbing flakes all having aspect ratios of about 140. In further embodiments, the EMI absorbing flakes may be variously sized such that each EMI absorbing flake need not be the same size or have the same aspect ratio as the other EMI absorbing flakes. As used herein, the aspect ratio can be calculated as the ratio of the longer (x) dimension to a shorter (y) dimension, where the x- and y-dimensions are substantially perpendicular in a common plane. Additional embodiments may include EMI absorbers comprising one or more of granules, spheroids, microspheres, ellipsoids, irregular spheroids, strands, powder, and/or a combination of any or all of these shapes.

With continued reference to FIG. 1, the method also includes step, process, or operation 102 at which the sheet is stretched along at least a first axis to generally align at least some of the EMI absorbing flakes, such as, for more efficient use. In some embodiments, the sheet may be stretched by extrusion or rollers, such as by stretching the sheet as it is rolled between a pair of rollers. In some embodiments, a significant number of flakes (e.g., about 20% to about 70%, etc.) of the EMI absorbing flakes are aligned after the stretching at step, process, or operation 102. In one particular embodiment, 70% of the flakes are aligned after the stretching, in other embodiments 20% of the flakes are aligned after stretching, in other embodiments more than 70% of the flakes are aligned after stretching, and in still further embodiments less than 20% of the flakes are aligned after stretching.

This particular example method illustrated in FIG. 1 refers to forming and stretching a sheet, but alternative embodiments may include other extruded objects and items besides sheets. For example, another exemplary method may include steps, processes, or operations in which the matrix material and EMI absorbing material are blended and then extruded into a three dimensional item or object that is not a sheet. Additionally, some embodiments may include other processes for making a stretched article (e.g., film, three dimensional object or item, etc.) that is suitable for use an EMI absorber. By way of example, other exemplary methods may include blown film extrusion, stretch blow molding, etc.

Figure 4:
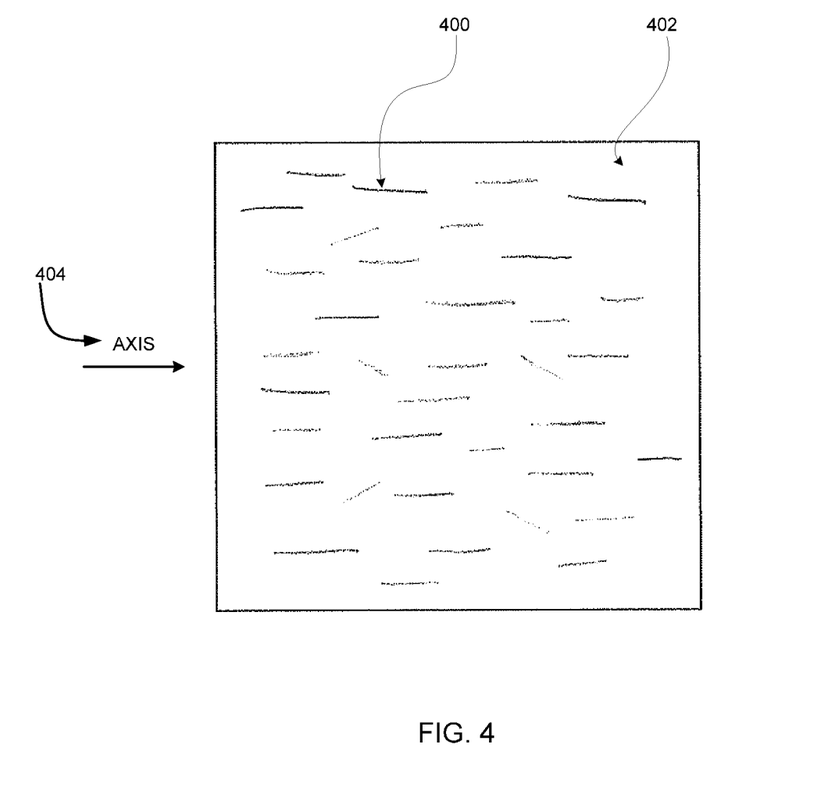
FIG. 4 illustrates an example of EMI absorbing flakes suspended in matrix material after stretching.

By way of example, FIG. 4 illustrates the EMI absorbing flakes 400 after stretching such that at least some of the EMI absorbing flakes 400 have been aligned generally in an end-to-end relationship. As shown by a comparison of FIG. 3 to FIG. 4, the stretching has caused at least some of the EMI absorbing flakes to shift or become oriented lengthwise such that their lengths or longitudinal axes is generally parallel with the axis 404 about which the sheet was stretched.

In addition to being stretched along a first axis (e.g., axis 404 shown in FIG. 4, etc.), some embodiments may also include stretching the sheet or other article along a second axis to align or further align the EMI absorbing flakes. Accordingly, the sheet or other article may be uniaxially stretched along only the first axis (stretching in only the X or Y direction) in some embodiments. While in other embodiments, the sheet or other article may be biaxially stretched along both the first and second axes (stretching in both the X and Y directions).

Depending on the particular embodiment and materials used for the matrix material and EMI absorbers, for example, the sheet or other article may be uniaxially stretched to achieve about 5% stretch to about 100% stretch along only the first axis in some embodiments. By way of example, the sheet or other article may be uniaxially stretched to achieve along only the first axis less than 5% stretch in some embodiments, about 5% stretch in some embodiments, more than 5% but less than 50% stretch in some embodiments, about 50% stretch in some embodiments, about 100% stretch in some embodiments, more than 100% stretch in some embodiments, etc. In these examples, 100% stretch refers to stretching the sheet or other article such the resulting stretched item or article has a length and/or width (e.g., 2 millimeters, etc.) twice as long or double its initial, original length or width (e.g., 1 millimeter, etc.), respectively, that it had before stretching.

Or, for example, the sheet or other article may be biaxially stretched to achieve about 5% to about 100% stretch in the X and/or Y directions. By way of example, the sheet or other article may be biaxially stretched to achieve along the X and/or Y axis less than 5% stretch in some embodiments, about 5% stretch in some embodiments, more than 5% but less than 50% stretch in some embodiments, about 50% stretch in some embodiments, about 100% stretch in some embodiments, more than 100% stretch in some embodiments, etc. In these examples, 100% stretch refers to stretching the sheet or other article such the resulting stretched item or article has a length and/or width (e.g., 2 millimeters, etc.) twice as long or double its initial, original length or width (e.g., 1 millimeter, etc.), respectively, that it had before stretching.

By way of example, the sheet may be stretched along the first axis and the second axis simultaneously. Or, for example, the sheet may be stretched along the first axis and the second axis sequentially. That is, the sheet may first be stretched along the first axis, and then the sheet may be stretched along the second axis (or vice versa). Moreover, the sheet may be repeatedly stretched along either the first and/or second axes depending on the particular embodiment.

In various embodiments, the first and second axes along which the sheet may be stretched are generally perpendicular to each other. In such embodiments, the first axis may be oriented generally parallel to the longitudinal axis or lengthwise direction of the sheet, and the second axis may be oriented generally parallel to the sheet's lateral axis or widthwise direction.

A wide range of EMI absorbing particles, fillers, flakes, etc. (which may also be referred to as microwave absorbing particles, fillers, flakes, etc.) may be used in exemplary embodiments of the present disclosure. The EMI (or microwave) absorbing particles, fillers, flakes, etc. may be made of various electrically conductive and/or magnetic materials. By way of example, various embodiments may include EMI absorbing particles comprising one or more of carbonyl iron, SENDUST (an alloy containing about 85% iron, 9.5% silicon and 5.5% aluminum), permalloy (an alloy containing about 20% iron and 80% nickel), iron silicide, iron-chrome compounds, metallic silver, magnetic alloys, magnetic powders, magnetic flakes, magnetic particles, nickel-based alloys and powders, chrome alloys, and any combinations thereof. Other embodiments may include one or more EMI absorbing particles formed from one or more of the above materials where the EMI absorbing particles comprise one or more of granules, spheroids, microspheres, ellipsoids, irregular spheroids, strands, flakes, powder, and/or a combination of any or all of these shapes. In such embodiments, the sheet or other article may still be stretched along one or more axes, where that stretching may help remove gaps and/or reduce spacing between the EMI absorbing particles and also may help reduce the through-thickness (thickness in the z-direction) of the resulting EMI absorber (e.g., sheet, film, article, three dimensional object or item, etc.) This, in turn, may help improve the EMI absorbing efficiency or properties of the EMI absorbing particles, thus allowing for the use of less EMI absorber particles (thus reducing material costs) while still having sufficient EMI absorbing properties.

Various exemplary embodiments include individual EMI absorbing flakes having, for example, a mean or average thickness of about 0.1 micrometers ($\mu$m) to 1.0 $\mu$m. Individual EMI absorbing flakes may have, for example, a face with a mean surface area expressed in $\mu$m squared and a mean thickness expressed in $\mu$m, and the mean surface area is about 1000 to 7000 times greater than the mean thickness. An example EMI absorbing flake is manufactured by Steward Advanced Materials (www.stewardmaterials.com) called "Iron Silicide Type IV." In this example, the flake thickness is about 0.1 $\mu$m to 0.3 $\mu$m and the flake plane diameter is about 20 $\mu$m to 30 $\mu$m. Alternative embodiments may include EMI absorbing particles configured differently and in different sizes. The dimensions provided in this paragraph (as are all dimensions disclosed herein) are for purposes of illustration only and not for purposes of limitation.

In some embodiments, the EMI absorbing flakes comprise magnetic material, such as a magnetic material with a magnetic relative permeability greater than 2 at 1.0 Megahertz. In one particular embodiment, the EMI absorbing flakes have a relative magnetic permeability greater than about 3.0 at approximately 1.0 Gigahertz, and greater than about 1.5 at 10 Gigahertz. Alternative embodiments may include EMI absorber configured differently and in different sizes. These specific numerical values provided in this paragraph (as are all numerical values disclosed herein) are for purposes of illustration only and not for purposes of limitation.

In regard to the matrix material, a wide range of materials may also be used. By way of example, various embodiments include thermoplastic matrix materials, such as polyolefins, polyamides, polyesters, polyurethanes, polycarbonates, polystyrene and styrenic copolymers, acrylnitriles, polyvinyl chlorides, polysulfones, acetals, polyarlyates, polypropylenes, surlyns, polyethylene terephthalates, polystyrenes, combinations thereof, etc.

The matrix material may be selected based on the particular amount of EMI absorbing flakes that may be suspended or added to the matrix material. For example, some embodiments may include a matrix material that is able to accept and suspend a volume of EMI absorbing flakes (for example, loadings of 15 to 40 volume percentage, less than 15 volume percentage, greater than 40 volume percentage, etc.) without compromising the other advantageous properties of the matrix material, such as ability to be stretched and to maintain the alignment of the EMI absorbing flakes after stretching.

The matrix material may also be substantially transparent to electromagnetic energy so that the matrix material does not impede the absorptive action of the EMI absorbing filler (e.g., flakes, etc.) in the matrix material. For example, a matrix material exhibiting a relative dielectric constant of less than approximately 4 and a loss tangent of less than approximately 0.1 is sufficiently transparent to EMI. Values outside this range, however, are also contemplated as these specific numerical values provided in this paragraph (as are all numerical values disclosed herein) are for purposes of illustration only and not for purposes of limitation.

Figure 2:
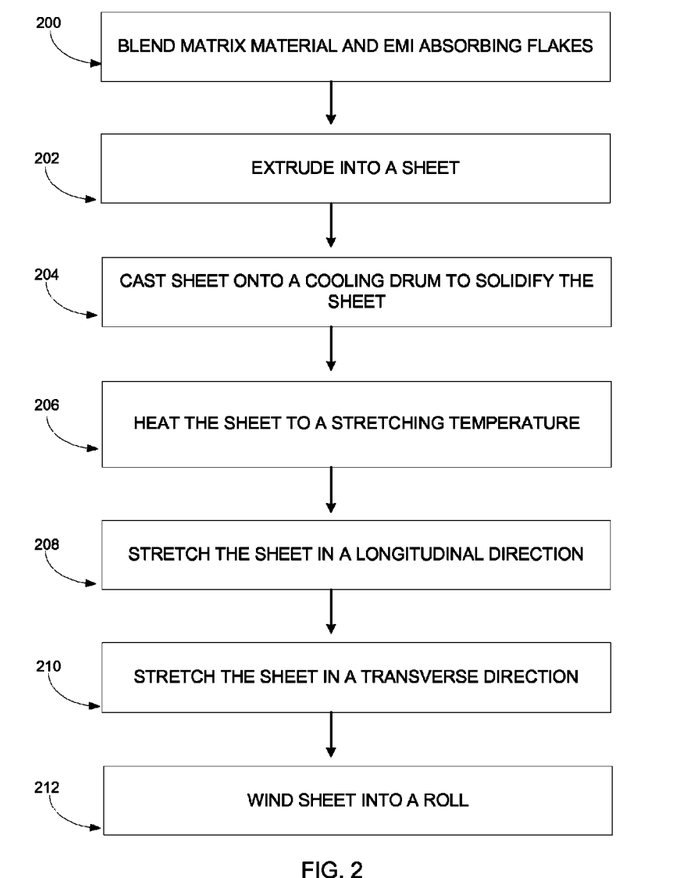
FIG. 2 is a block diagram of another exemplary method of making an EMI absorber.

FIG. 2 is a process flow chart illustrating the steps, processes, or operations for another exemplary method of the present disclosure. As shown in FIG. 2, this method includes step, process, or operation 200 in which the matrix material and EMI absorbing flakes are blended and then extruded into a sheet at step, process, or operation 202. This particular example includes an extruded sheet. Alternative embodiments may include other extruded objects and items besides sheets or films. For example, another exemplary method may include steps, processes, or operations in which the matrix material and EMI absorbing material are blended and then extruded into a three dimensional article, item, or object that is not a sheet or film. Additionally, some embodiments may include other processes for making a stretched article (e.g., film, sheet, three dimensional object or item, etc.) that is suitable for use as an EMI absorber. By way of example, other exemplary methods may include blown film extrusion, stretch blow molding, etc. In some embodiments, the EMI absorber comprises a multi-layer structure that has been stretched, such as by sheet extruders and the like. In these embodiments, a method of making an EMI absorber may thus generally include stretching a multi-layer structure, such as by sheet extruders and the like.

With continued reference to FIG. 2, the sheet is cast onto a cooling drum to solidify the sheet at step, process, or operation 204. The sheet is heated to a stretching temperature at step, process, or operation 206. The sheet is then stretched in, for example, a longitudinal direction at step, process, or operation 208. The sheet may additionally or alternatively be stretched in, for example, a transverse direction at step, process, or operation 210. The biaxial stretching along two axes in the X and Y directions may be performed sequentially or simultaneously as noted above. At step, process, or operation 212, the stretched sheet may be wound into a roll or wound onto a spool, for example, for transport or storage.

For this particular method shown in FIG. 2, the matrix material and EMI absorbers may comprise the various materials listed above. In one particular exemplary embodiment, the matrix material and EMI absorbers are selected such that the method yields a stretched thermoplastic sheet with flake iron silicide fillers that are generally aligned as a result of the stretching steps, processes, or operations 208, 210. The alignment of the iron silicide flakes may improve the EMI absorbing efficiency thereof, thus allowing less EMI absorbing filler materials to be used (thus reducing costs) while still obtaining sufficient EMI absorption.

As noted above, FIG. 3 illustrates EMI absorbing flakes 300 suspended in matrix material 302 before stretching such that the flakes 300 are generally unaligned and randomly dispersed in the matrix material 302. In comparison, FIG. 4 illustrates the flakes 400 and matrix material 402 after stretching along the first axis 402 such that some of the flakes 400 have been generally aligned along the axis 402. This stretching and alignment of flakes may help remove gaps and/or reduce spacing between the flakes, as well as reduce the through-thickness or thickness in the z-direction (into the page in FIG. 4) of the resulting EMI absorber (e.g., film, sheet, article, three dimensional item or object, etc.). This, in turn, may improve the EMI absorbing properties or efficiency of the flakes, thus allowing for the use of less of those EMI absorbing flakes (thus reducing material costs) while still having sufficient or good EMI absorbing properties.

The relative sizes of the individual EMI absorbing flakes 300, 400 to each other and to the matrix material 302, 402 is shown in FIGS. 3 and 4 for illustration purposes only. In general, the suspended EMI absorbing flakes may be extremely small (that is, microscopic). Small filler particles allow for embodiments of an EMI absorbing sheet to have an overall thickness that is relatively thin.

Similarly, the relative shapes of the EMI absorbing flakes or particles may be any arbitrary shape. The elongate shape of the EMI absorbing flakes 300, 400 are shown in FIGS. 3 and 4 for illustration purposes only. Other embodiments may include one or more EMI absorbing flakes or particles having a different shape than that illustrated in FIGS. 3 and 4. For example, various embodiments of an EMI absorber may include a stretched sheet (sheet stretched along a first and/or second axis) and one or more EMI absorbing fillers or particles comprising granules, spheroids, microspheres, ellipsoids, irregular spheroids, strands, flakes, powder, and/or a combination of any or all of these shapes. In such embodiments, the sheet may still be stretched along one or more axes, where that stretching may help remove gaps and/or reduce spacing between the EMI absorbing particles and also may help reduce the through-thickness or thickness in the z-direction of the resulting EMI absorber (e.g., film, sheet, article, three dimensional item or object, etc.). This, in turn, may improve the EMI absorbing properties or efficiency of the EMI absorbing particles, thus allowing for the use of less of those EMI absorbing particles (thus reducing material costs) while still having sufficient or good EMI absorbing properties.

In operation, an EMI absorber (e.g., film, sheet, article, three dimensional object or item, etc.) according to exemplary embodiments disclosed herein may be operable for absorbing a portion of the EMI incident upon the EMI absorber, thereby reducing transmission of EMI therethrough over a range of operational frequencies (e.g., a frequency range of about 10 gigahertz or more, a frequency range of about 100 megahertz to about 1 gigahertz, etc.). The EMI absorber may remove a portion of the EMI from the environment through power dissipation resulting from loss mechanisms. These loss mechanisms include polarization losses in a dielectric material and conductive, or ohmic, losses in a conductive material having a finite conductivity.

The EMI absorber (e.g., film, sheet, article, three dimensional object or item, etc.) may further include an adhesive layer. In some embodiments, the adhesive layer is formulated using a pressure-sensitive adhesive. The pressure-sensitive adhesive (PSA) may be generally based on compounds including acrylic, silicone, rubber, and combinations thereof. The adhesive layer can be used to affix the EMI absorber to a portion of an EMI shield, such as to a single piece EMI shield, to a cover, lid, frame or other portion of a multi-piece shield, to a discrete EMI shielding wall, etc. Alternative affixing methods can also be used such as, for example, mechanical fasteners. In some embodiments, an EMI absorber (e.g., film, sheet, etc.) may be attached to a removable lid or cover of a multi-piece EMI shield. The EMI absorber may be placed, for example, on the inner surface of the cover or lid. Alternatively, the EMI absorber may be placed, for example, on the outer surface of the cover or lid. The EMI absorber may be placed on an entire surface of the cover or lid or on less than an entire surface. For example, the EMI absorber may be placed on a frame or base and a separate EMI absorber may be placed on a removable lid or cover that is attachable to the frame or base. The EMI absorber may be applied at virtually any location at which it would be desirable to have an EMI absorber.

In any one or more of the various embodiments disclosed here, an EMI absorber (e.g., film, sheet, etc.) may be attached to a shield that includes a frame and a cover attachable to the frame. For example, the cover may include detents for securing the cover to a frame that is mounted on the circuit board. The cover may be pressed vertically downward onto the frame such that at least one locking snap engages and locks into a corresponding opening to thereby engage the cover to the frame. In some embodiments, the cover includes the locking snaps or catches (e.g., latches, tabs, detents, protuberances, protrusions, ribs, ridges, ramp-ups, darts, lances, dimples, half-dimples, combinations thereof, etc.) with the frame including the corresponding openings (e.g., recesses, voids, cavities, slots, grooves, holes, depressions, combinations thereof, etc.). In other embodiments, the frame includes the locking snaps or catches, and the cover includes the corresponding openings. In still further embodiments, the cover and frame may both include locking snaps or catches for engaging corresponding openings of the other component.

In some embodiments, an EMI absorber may be formed as a tape. The tape, for example, can be stored on a roll.

In some embodiments, desired application shapes, such as a rectangle and an ellipse can be die-cut from the EMI absorber, thereby yielding EMI absorbers of any desired two-dimensional shape. Accordingly, the EMI absorber can be die-cut to produce the desired outlines of an application shape.

In some embodiments, the EMI absorber may exhibit better thermal conductivity than air without any thermally conducting fillers. But in some embodiments, thermally conducting fillers may also be included in the matrix along with the EMI absorbing particles (e.g., flakes, etc.). In such embodiments, the resulting thermally-conductive EMI absorber material may be applied as a thermal conductive EMI absorbing material, for example, as between an electronic component (e.g., a "chip") and a heat sink. A wide range of thermally conducting fillers (e.g., ceramic materials, aluminum nitride, boron nitride, iron, metallic oxides, and combinations thereof, etc.) may be used, including thermally conductive fillers having a thermal impedance value substantially less than that of air. By way of example, various embodiments of an EMI absorber (e.g., film, sheet, article, three dimensional object or item, etc.) may include EMI absorbing particles (e.g., flakes, etc.) and thermally conducting fillers in the matrix, where the EMI absorber is stretched along at least a first and/or second axis.

Example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail. In addition, advantages and improvements that may be achieved with one or more exemplary embodiments of the present disclosure are provided for purpose of illustration only and do not limit the scope of the present disclosure, as exemplary embodiments disclosed herein may provide all or none of the above mentioned advantages and improvements and still fall within the scope of the present disclosure.

Specific dimensions, specific materials, and/or specific shapes disclosed herein are example in nature and do not limit the scope of the present disclosure. The disclosure herein of particular values and particular ranges of values for given parameters are not exclusive of other values and ranges of values that may be useful in one or more of the examples disclosed herein. Moreover, it is envisioned that any two particular values for a specific parameter stated herein may define the endpoints of a range of values that may be suitable for the given parameter (i.e., the disclosure of a first value and a second value for a given parameter can be interpreted as disclosing that any value between the first and second values could also be employed for the given parameter). Similarly, it is envisioned that disclosure of two or more ranges of values for a parameter (whether such ranges are nested, overlapping or distinct) subsume all possible combination of ranges for the value that might be claimed using endpoints of the disclosed ranges.

The terminology used herein is for the purpose of describing particular example embodiments only and is not intended to be limiting. As used herein, the singular forms "a", "an" and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on", "engaged to", "connected to" or "coupled to" another element or layer, it may be directly on, engaged, connected or coupled to the other element or layer, or intervening elements or layers may be present. In contrast, when an element is referred to as being "directly on," "directly engaged to", "directly connected to" or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items. The term "about" when applied to values indicates that the calculation or the measurement allows some slight imprecision in the value (with some approach to exactness in the value; approximately or reasonably close to the value; nearly). If, for some reason, the imprecision provided by "about" is not otherwise understood in the art with this ordinary meaning, then "about" as used herein indicates at least variations that may arise from ordinary methods of measuring or using such parameters. For example, the terms "generally", "about", and "substantially" may be used herein to mean within manufacturing tolerances.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

Spatially relative terms, such as "inner," "outer," "beneath", "below", "lower", "above", "upper" and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The foregoing description of the embodiments has been provided for purposes of illustration and description. It is not intended to be exhaustive or to limit the disclosure. Individual elements, intended or stated uses, or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

What is claimed is:

1. A method of making an electromagnetic interference (EMI) absorber comprising stretching a material that includes EMI absorbing particles along at least a first axis to align at least some EMI absorbing particles, wherein:
   the material includes at least 15 volume percentage of the EMI absorbing particles; and
   at least some of the EMI absorbing particles comprise magnetic particles.

2. The method of claim 1, further comprising stretching the material along a second axis, and wherein:
   the volume percentage of the EMI absorbing particles in the material is at least 40 volume percentage;
   the EMI absorbing particles have a magnetic relative permeability greater than 3.0 at 1.0 gigahertz, and greater than 1.5 at 10 gigahertz; and
   the EMI absorber is operable for absorbing EMI to thereby reduce transmission of EMI therethrough over a range of operational frequencies including at least one of a frequency range of about 10 gigahertz or more, or a frequency range of about 100 megahertz to about 1 gigahertz.

3. The method of claim 2, wherein the second axis is generally perpendicular to the first axis.

4. The method of claim 2, wherein stretching the material along the first axis and stretching the material along the second axis is performed simultaneously.

5. The method of claim 1, wherein:
the material comprises EMI absorbing particles suspended in a matrix material; and
the method further comprises suspending the EMI absorbing particles in the matrix material before stretching such that the volume percentage of the EMI absorbing particles in the matrix material is at least 40 volume percentage.

6. The method of claim 1, wherein the material comprises a sheet, and wherein the stretching comprises stretching the sheet along at least the first axis, whereby the EMI absorber is operable for absorbing EMI to thereby reduce transmission of EMI therethrough over a range of operational frequencies including at least one of a frequency range of about 10 gigahertz or more, or a frequency range of about 100 megahertz to about 1 gigahertz.

7. The method of claim 6, further comprising forming the sheet from EMI absorbing particles suspended in a matrix material, and wherein the EMI absorbing particles have a magnetic relative permeability greater than 3.0 at 1.0 Gigahertz, and greater than 1.5 at 10 Gigahertz.

8. The method of claim 1, wherein stretching the material that includes the EMI absorbing particles reduces spacing between the EMI absorbing particles, and helps reduce the through-thickness of the material, improves the EMI absorbing properties of the stretched material that includes the EMI absorbing particles.

9. The method of claim 1, wherein:
the volume percentage of the EMI absorbing particles in the material is at least 40 volume percentage;
the EMI absorbing particles have a magnetic relative permeability greater than 3.0 at 1.0 gigahertz, and greater than 1.5 at 10 gigahertz; and
the EMI absorber is operable for absorbing EMI to thereby reduce transmission of EMI therethrough over a range of operational frequencies including at least one of a frequency range of about 10 gigahertz or more, or a frequency range of about 100 megahertz to about 1 gigahertz.

10. The method of claim 1, wherein:
the material comprises a thermoplastic sheet; and
the EMI absorbing particles comprise EMI absorbing magnetic particles selected from the group consisting of: carbonyl iron, SENDUST, permalloy, iron silicide, iron-chrome compounds, or a combination thereof; and
the EMI absorbing particles comprises EMI absorbing particles having a shape selected from the group consisting of granules, spheroids, microspheres, ellipsoids, irregular spheroids, strands, flakes, powder, or a combination thereof.

11. The method of claim 1, wherein the EMI absorbing particles comprise flakes, at least some of the individual flakes having at least one feature selected from the group consisting of:
a mean thickness of about 0.1 μm to 1.0 μm;
an aspect ratio within a range of about 10 to about 140;
a face with a mean surface area expressed in μm squared and a mean thickness expressed in μm, where the mean surface area is about 1000 to 7000 times greater than the mean thickness;
a magnetic relative permeability greater than 2 at 1.0 Megahertz; or
a combination thereof.

12. The method of claim 1, further comprising attaching the stretched material that includes the EMI absorbing particles to a single piece EMI shield or to a lid of a multi-piece EMI shield that is attachable to a frame of the multi-piece shield.

13. An EMI absorbing article or film made by the method of claim 1, wherein the EMI absorbing particles have a magnetic relative permeability greater than 3.0 at 1.0 gigahertz, and greater than 1.5 at 10 gigahertz, whereby the EMI absorbing article or film is operable for absorbing EMI to thereby reduce transmission of EMI therethrough over a range of operational frequencies including at least one of a frequency range of about 10 gigahertz or more, or a frequency range of about 100 megahertz to about 1 gigahertz.

14. An electromagnetic interference (EMI) absorber comprising a material stretched along at least a first axis and that includes EMI absorbing particles, at least some of which are aligned generally parallel with the first axis, wherein:
the material includes at least 15 volume percentage of the EMI absorbing particles; and
at least some of the EMI absorbing particles comprise magnetic particles.

15. The EMI absorber of claim 14, wherein the material comprises a sheet stretched along the first axis and a second axis, and wherein:
the volume percentage of the EMI absorbing particles in the material is at least 40 volume percentage;
the EMI absorbing particles have a magnetic relative permeability greater than 3.0 at 1.0 gigahertz, and greater than 1.5 at 10 gigahertz; and
the EMI absorber is operable for absorbing EMI to thereby reduce transmission of EMI therethrough over a range of operational frequencies including at least one of a frequency range of about 10 gigahertz or more, or a frequency range of about 100 megahertz to about 1 gigahertz.

16. The EMI absorber of claim 15, wherein the second axis is generally perpendicular to the first axis.

17. The EMI absorber of claim 14, wherein the EMI absorbing particles comprise flakes having a length aligned generally parallel with the first axis.

18. The EMI absorber of claim 14, wherein:
the material comprises a matrix material loaded with the EMI absorbing particles such that the volume percentage of the EMI absorbing particles in the matrix material is at least 40 volume percentage; and
the EMI absorbing particles comprises one or more EMI absorbing particles having a shape selected from the group consisting of granules, spheroids, microspheres, ellipsoids, irregular spheroids, strands, flakes, powder, or a combination thereof; and
the EMI absorbing particles comprise EMI absorbing magnetic particles selected from the group consisting of carbonyl iron, SENDUST, permalloy, iron silicide, iron-chrome compounds, or a combination thereof.

19. The EMI absorber of claim 14, wherein the EMI absorbing particles comprise flakes, at least some of the individual flakes having at least one feature selected from the group consisting of:
a mean thickness of about 0.1 μm to 1.0 μm;
an aspect ratio within a range of about 10 to about 140;
a face with a mean surface area expressed in μm squared and a mean thickness expressed in μm, where the mean surface area is about 1000 to 7000 times greater than the mean thickness;

a magnetic relative permeability greater than 2 at 1.0 Megahertz; or a combination thereof.

20. The EMI absorber of claim 14, wherein the EMI absorber is a film, and wherein:
- the volume percentage of the EMI absorbing particles in the material is at least 40 volume percentage;
- the EMI absorbing particles have a magnetic relative permeability greater than 3.0 at 1.0 gigahertz, and greater than 1.5 at 10 gigahertz; and
- the EMI absorber is operable for absorbing EMI to thereby reduce transmission of EMI therethrough over a range of operational frequencies including at least one of a frequency range of about 10 gigahertz or more, or a frequency range of about 100 megahertz to about 1 gigahertz.

21. An electromagnetic interference (EMI) shielding apparatus having a portion to which is attached the EMI absorber of claim 14, wherein the EMI shielding apparatus comprises a single piece EMI shield or a multi-piece EMI shield that includes a lid attachable to a frame.

\* \* \* \* \*